(12) United States Patent
Merz

(10) Patent No.: US 7,390,197 B2
(45) Date of Patent: Jun. 24, 2008

(54) ELECTRONIC DEVICE WITH INTEGRAL CONNECTORS

(75) Inventor: Nicholas G. L. Merz, San Carlos, CA (US)

(73) Assignee: OQO Incorporated, San Francisco, CA (US)

( * ) Notice: Subject to any disclaimer, the term of this patent is extended or adjusted under 35 U.S.C. 154(b) by 0 days.

(21) Appl. No.: 10/197,378

(22) Filed: Jul. 17, 2002

(65) Prior Publication Data

US 2004/0014336 A1    Jan. 22, 2004

(51) Int. Cl.
    *H01R 12/00* (2006.01)
(52) U.S. Cl. .................. 439/76.1; 439/607
(58) Field of Classification Search ............. 439/76.1, 439/446, 607–610, 55, 676, 79; 361/737, 361/740, 741, 747, 756, 759, 742
    See application file for complete search history.

(56) References Cited

U.S. PATENT DOCUMENTS

| | | | | | |
|---|---|---|---|---|---|
| 3,803,533 | A | * | 4/1974 | Taplin | ................. 439/328 |
| 4,015,070 | A | * | 3/1977 | Theurer | ................. 174/52.1 |
| 4,681,712 | A | * | 7/1987 | Sakakibara et al. | ......... 264/440 |
| 5,322,447 | A | | 6/1994 | Okada | |
| 5,754,404 | A | * | 5/1998 | Biermann et al. | ........... 361/737 |
| 5,954,536 | A | * | 9/1999 | Fuerst et al. | ................. 439/493 |
| 6,008,994 | A | * | 12/1999 | Bates | ................. 361/737 |
| 6,210,216 | B1 | * | 4/2001 | Tso-Chin et al. | ............ 439/545 |
| 6,247,967 | B1 | * | 6/2001 | Wu et al. | ................... 439/607 |
| 6,383,024 | B1 | * | 5/2002 | Wang et al. | ................. 439/607 |
| 6,475,021 | B1 | * | 11/2002 | Tan et al. | .................... 439/446 |
| 6,592,405 | B1 | * | 7/2003 | Hasircoglu | ................. 439/607 |
| 6,629,181 | B1 | * | 9/2003 | Alappat et al. | ............. 710/300 |
| 6,629,851 | B1 | | 10/2003 | Kikuchi et al. | |
| 6,752,662 | B2 | * | 6/2004 | Okamoto | .................... 439/607 |

* cited by examiner

*Primary Examiner*—Edwin A. León
(74) *Attorney, Agent, or Firm*—Mattingly, Stanger, Malur & Brundidge

(57) ABSTRACT

An electronic device having one or more integral connectors is disclosed. The connector includes an electromagnetically-shielded cavity defined by an outer shell integrally formed in the housing and having a cross-sectional profile of a plug to which the connector may mate. The connector also includes a tongue integrally formed in and extending from a component (such as a printed circuit board) of the electronic device and protruding into the cavity. The tongue may have one or more electrical contacts on one or both sides. The connector may also include one or more snap features for retaining a mated plug at a predetermined force. The connectors may conform to one or more connector standards, such as the Universal Serial Bus (USB) standard and/or the IEEE 1394 (FireWire®) standard. Devices incorporating such integral connectors may be smaller and manufactured less expensively than devices having conventional, non-integral, connectors.

12 Claims, 14 Drawing Sheets

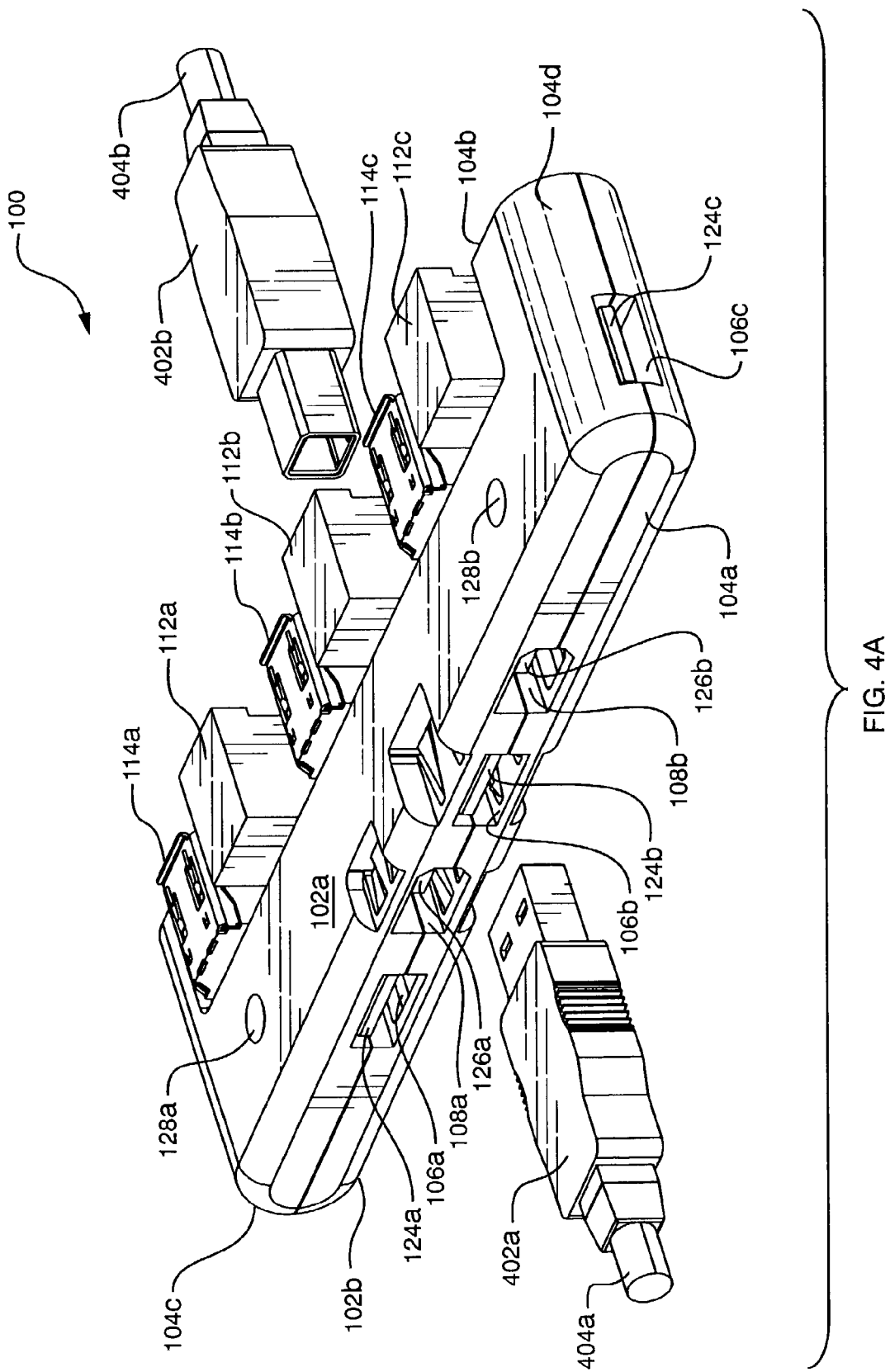

ELECTRONIC DEVICE WITH INTEGRAL CONNECTORS

BACKGROUND

1. Field of the Invention

The present invention relates to electronic devices and, more particularly, to connectors for physically and electrically connecting electronic devices to each other.

2. Related Art

Electronic devices, such as personal computers, personal digital assistants (PDAs), and cellular telephones typically have electrical input and output connectors for receiving and transmitting electrical signals. Examples of such connectors include power jacks, headphone jacks, Universal Serial Bus (USB) connectors, IEEE 1394 (FireWire®) connectors, and other connectors which carry data and power into and from electronic devices.

Typically, a plug at the end of a cable is connected to a device connector, thereby forming a connection for carrying data and/or power to and from the device. Each kind of connector is designed for use with a corresponding kind of plug. Devices may typically be interconnected with each other either by connecting them together directly with cables or by connecting them indirectly through an intermediate network device, such as a hub.

Functions of connectors include: (1) making a reliable and repeatable electrical connection with the cable to which it mates, (2) making a reliable and repeatable physical connection with the cable to which it mates, and (3) providing a sufficient electromagnetic interference (EMI) seal around signals as they pass between the device and the cable. Not all connectors, however, perform all of these functions. Connectors typically are manufactured as separate metal and/or plastic components that may be soldered to a printed circuit board (PCB) or mounted to a housing and connected internally to a PCB with wires.

Although most existing connector types were originally designed for use with relatively large devices, such as desktop computers and printers, portable electronic devices increasingly use such connectors as the demand increases for portable electronic devices having communications capabilities. Mounting a conventional connector to a PCB increases the size of the PCB and may thereby increase the size of the electronic device containing the PCB. Although this may not pose a problem for relatively large electronic devices, such as desktop computers, the size increase caused by connectors may be significant in the context of portable electronic devices. The height of a connector, for example, may represent a significant fraction of the total height of a portable device. The size of conventional connectors may therefore be a limiting factor in attempts to miniaturize portable electronic devices.

What is needed, therefore, are improved techniques for providing electrical connectors within portable electronic devices.

SUMMARY

An electronic device having one or more integral connectors is disclosed. The connector includes an electromagnetically-shielded cavity defined by an outer shell integrally formed in the housing and having a cross-sectional profile of a plug to which the connector may mate. The connector also includes a tongue integrally formed in and extending from a component (such as a printed circuit board) of the electronic device and protruding into the cavity. The tongue may have one or more electrical contacts on one or both sides. The connector may also include one or more snap features for retaining a mated plug at a predetermined force. The connectors may conform to one or more connector standards, such as the Universal Serial Bus (USB) standard and/or the IEEE 1394 (FireWire®) standard. Devices incorporating such integral connectors may be smaller and manufactured less expensively than devices having conventional, non-integral, connectors.

Other features and advantages of various aspects and embodiments of the present invention will become apparent from the following description and from the claims.

BRIEF DESCRIPTION OF THE DRAWINGS

FIG. 4A is a front perspective view of the electronic device of FIG. 1A and associated plugs for a single USB pass-through;

FIG. 4B is a front perspective view of the electronic device of FIG. 1A and associated plugs for a single IEEE 1394 pass-through;

DETAILED DESCRIPTION

Figure 1A:
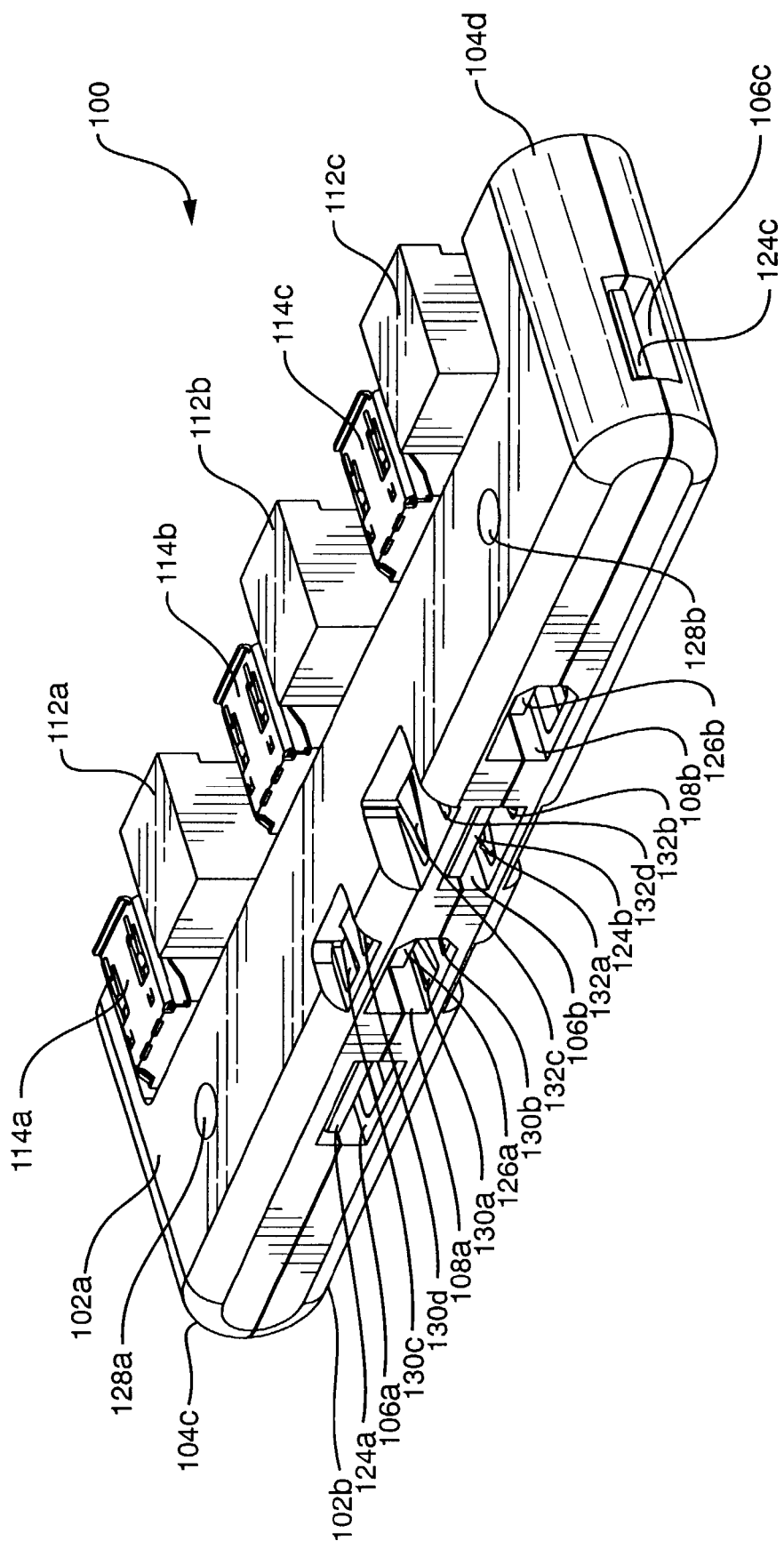
FIG. 1A is a perspective front view of an electronic device having integral connectors according to one embodiment of the present invention.

In one aspect of the present invention, an electronic device having at least one integral connector is provided. Physical and electrical features of the connectors are integrated into the housing and circuit board of the electronic device itself, thereby eliminating the need for separate connectors. The electronic device's integral connectors may satisfy the requirements of standards such as USB and IEEE 1394 without the use of the distinct connector components that are typically used to implement connectors according to such standards. Furthermore, if multiple connector types in the electronic device share a common physical attribute, such as a central tongue with electrical contacts formed thereon, the same component in the device (e.g., the PCB) may be used to implement the common physical attribute for the multiple connector types.

In one aspect of the present invention, a connector in an electronic device may be formed from:

(1) an electromagnetically-shielded cavity formed in the housing of the electronic device, which serves as the outer shell of the connector; and (2) a wide and flat peninsula extending from a PCB in the electronic device into the cavity and which has electrical contacts formed thereon, thereby serving as the "tongue" of the connector.

Because integral connectors designed and constructed in accordance with the present invention need not include additional components coupled to the housing of the electronic device, the use of such integral connectors may enable the size of the electronic device to be substantially unaffected by the inclusion of the connectors. As a result, the use of integral connectors in accordance with the present invention may enable the design of more compact electronic devices.

Referring to FIGS. 1A-1E, the present invention will be described with reference to an example embodiment of an electronic device 100 which includes two kinds of integral connectors having a common physical attribute. In this particular example, both kinds of connectors are "tongue" connectors. The common physical attribute that they share is therefore a central tongue with electrical contacts formed thereon. The outer shell of a tongue connector is typically constructed of formed sheet metal and encloses a cavity having the cross-sectional profile of the plug to which it mates. Protruding from the back wall of the cavity is a wide and flat "tongue," typically constructed of plastic, having electrical contacts on one or more surfaces. The shell of the connector may have formed features (referred to as "snap" features) for retaining a mated plug at a specified force.

In this particular example, the electronic device 100 includes both Universal Serial Bus (USB) connectors 502a-c and IEEE 1394 connectors 504a-c (FIG. 5), both of which are examples of "tongue" connectors. USB is defined in the Universal Serial Bus Specification, Revision v2.0, dated Apr. 27, 2000, hereby incorporated by reference. FireWire is defined by IEEE Standard 1394b, draft 1.0, dated Feb. 25, 2000, hereby incorporated by reference. In addition to defining physical and electrical properties of connectors and corresponding plugs, these standards define communications protocols to be used to transmit and receive information, as well as physical mating conditions for connectors, such as insertion force, retention force, and cycle life.

The device 100 includes an upper housing 102a and a lower housing 102b constructed of, e.g., injection-molded plastic. Two screws 128a-b assemble the housings 102a-b to each other. Forward face 104a of electronic device 100 includes four cavities 106a-b and 108a-b. The portions of housings 102a-b which enclose cavities 106a-b serve as the outer shells of USB connectors designed according to the present invention, while the portions of housings 102a-b which enclose cavities 108a-b serve as the outer shells of IEEE 1394 connectors designed according to the present invention.

Electronic device 100 also includes two radiused faces 104c (illustrated most clearly in FIG. 1D) and 104d. Face 104c includes a cavity 108c (FIG. 1D), having the same cross-sectional profile as cavities 108a-b, which encloses an IEEE 1394 connector designed according to the present invention. Face 104d includes a cavity 106c, having the same cross-sectional profile as cavities 106a-b, which encloses a USB connector designed according to the present invention.

Each of the cavities 106a-c and 108a-c is designed to receive a corresponding (USB or IEEE 1394) plug. The portions of the housings 102a-b that form the cavities 106a-c and 108a-c have the cross-sectional profiles of the corresponding (USB or IEEE 1394) plug to which they mate and thereby serve as the outer shells of (USB or IEEE 1394) tongue connectors. Therefore, the dimensions of cavities 106a-c conform to the requirements of the USB specification and the dimensions of cavities 108a-c conform to the requirements of the IEEE 1394 specification. The cavity-forming portions of the housings 102a-b may be lined with an EMI-shielding substrate. As described in more detail below, the cavity-forming portions of the housings 102a-b may also have snap features for retaining a mated plug at a specified force.

Figure 2A:
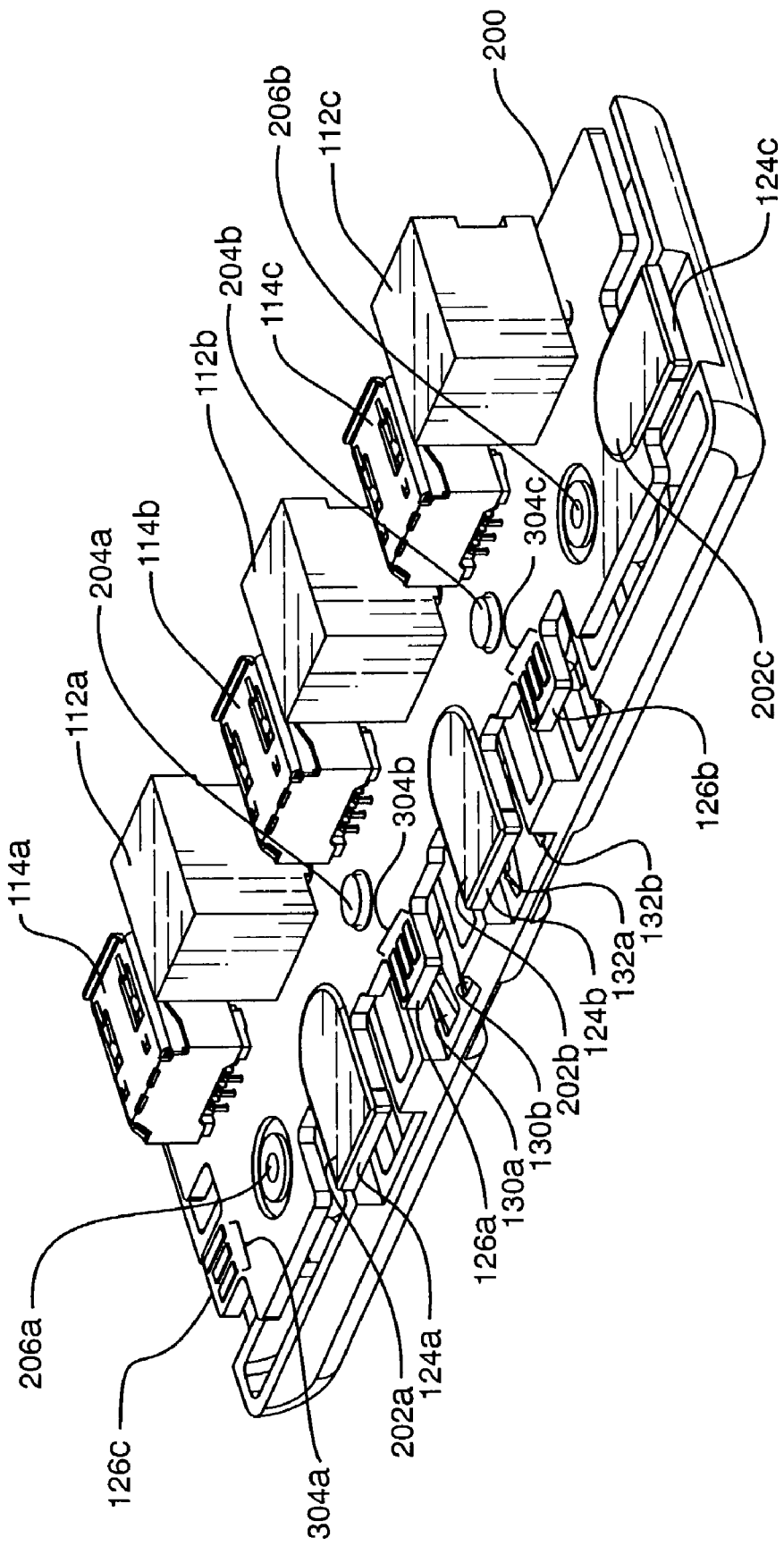
FIG. 2A is a perspective front view of the electronic device of FIG. 1A with its upper housing removed.
Figure 2B:
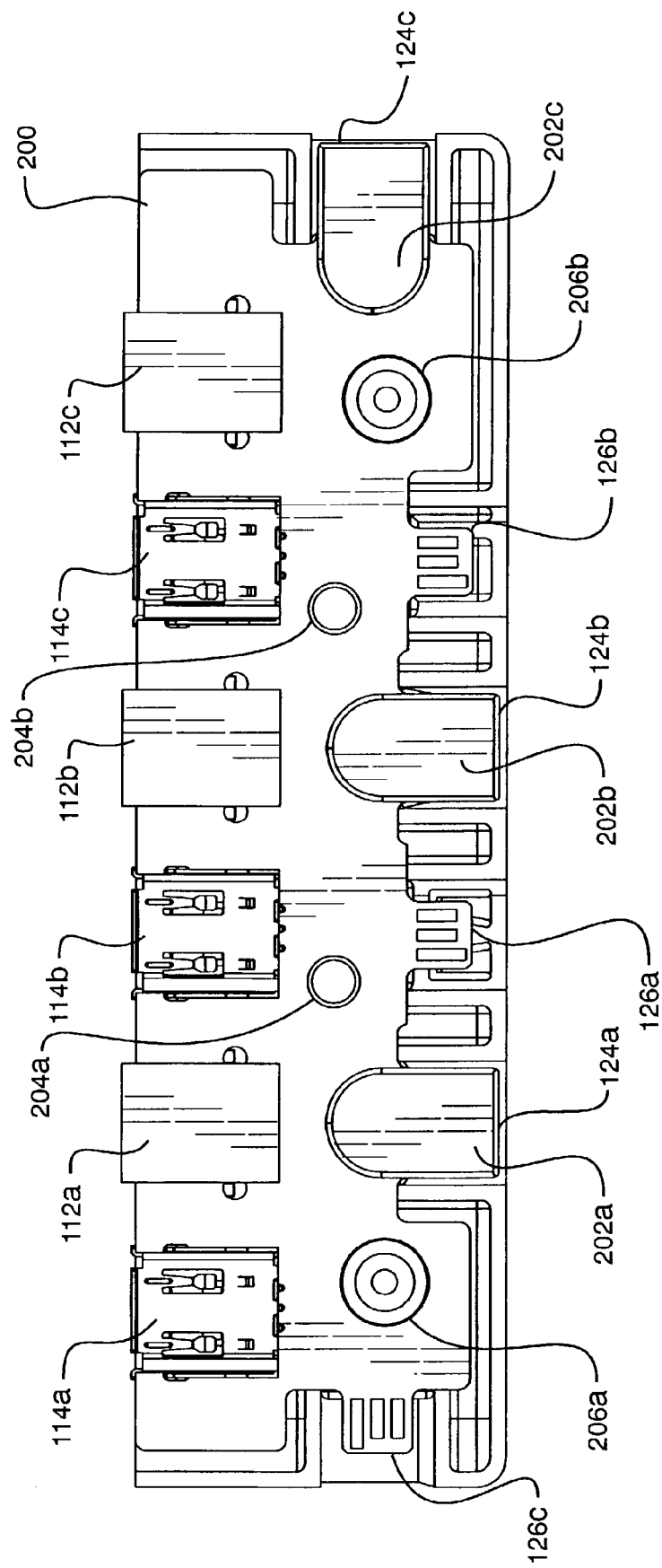
FIG. 2B is a top view of the electronic device of FIG. 1A with its upper housing removed.
Figure 3A:
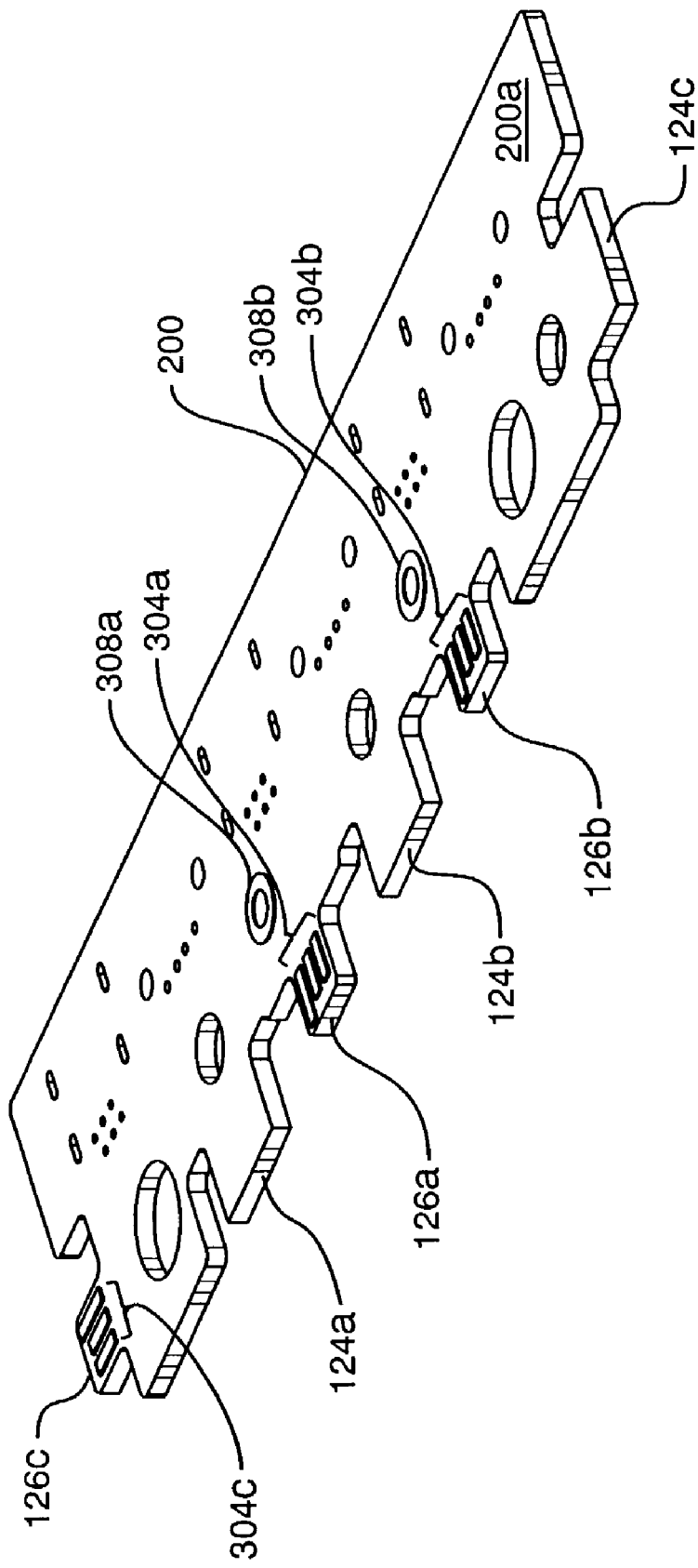
FIG. 3A is a front perspective view of a printed circuit board component of the electronic device of FIG. 1A.
Figure 3B:
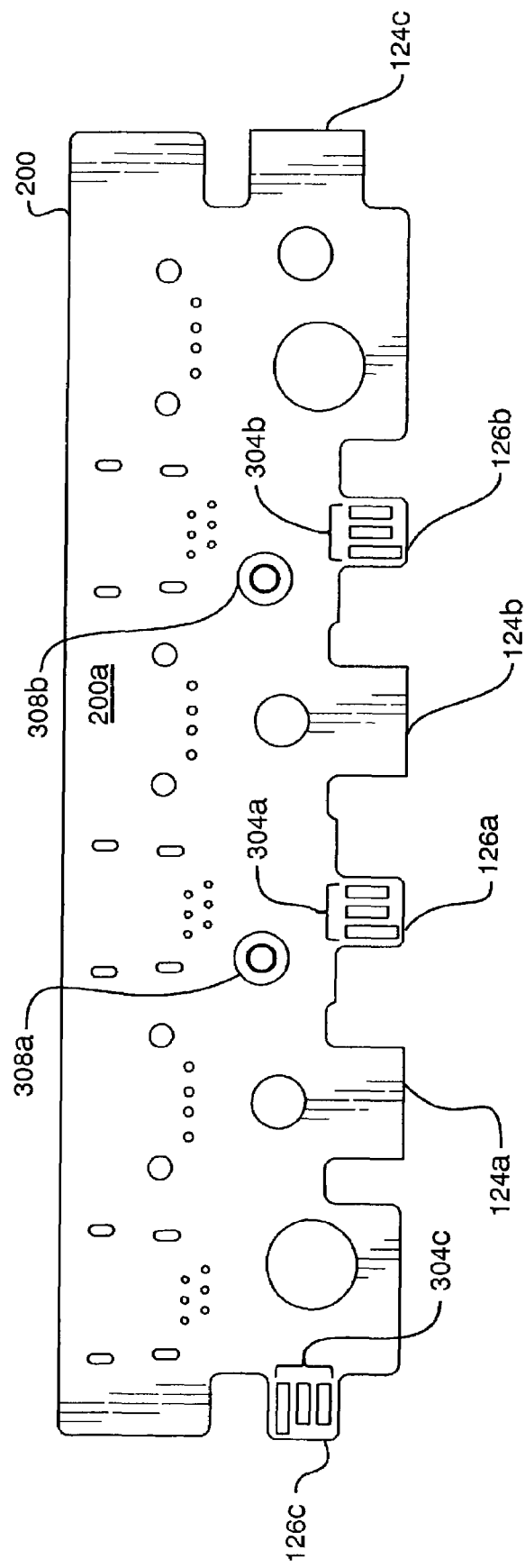
FIG. 3B is a top view of the printed circuit board of FIG. 3A.
Figure 3C:
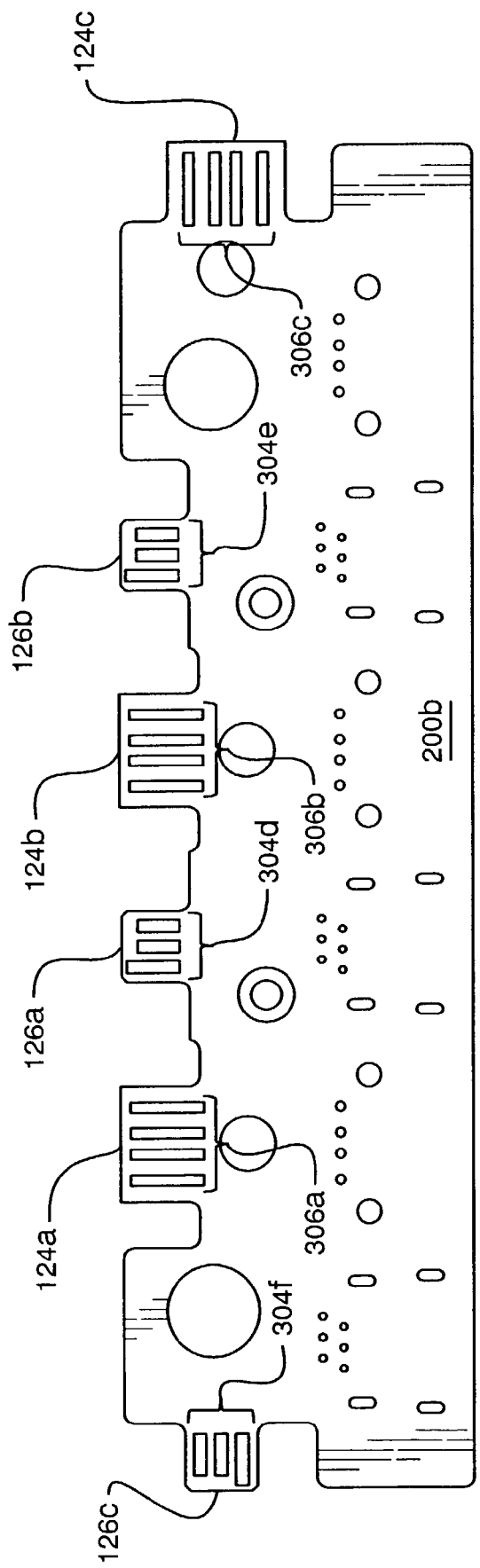
FIG. 3C is a bottom view of the printed circuit board of FIG. 3A.
Figure 5:
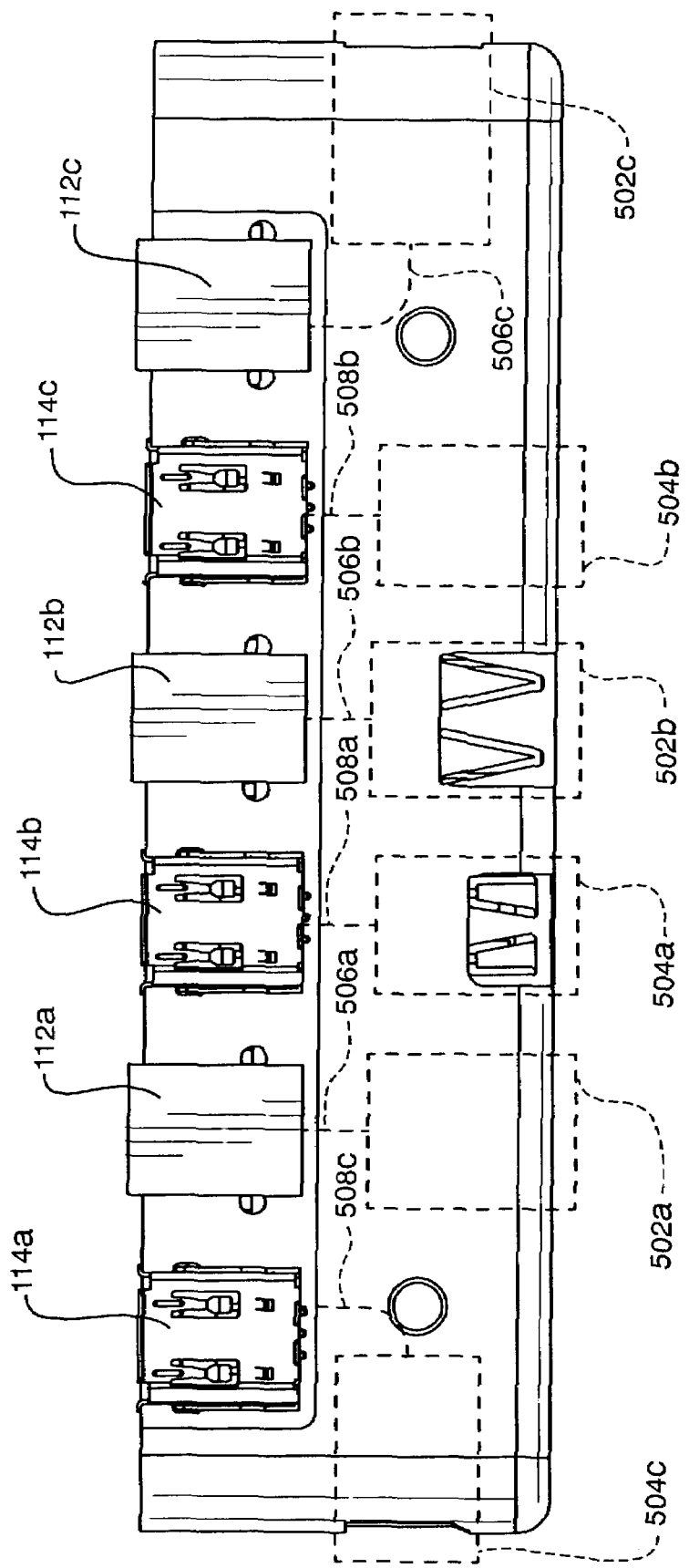
FIG. 5 is a top view of the electronic device of FIG. 1A in which embodiments of electronic connectors designed according to the present invention are illustrated in broken outline.

Referring to FIGS. 2A-2C, the electronic device 100 also includes a printed circuit board (PCB) 200, two screws 204a-b to mount the PCB 200 to the lower housing 102b, and two threaded brass inserts 206a-b which have been heat-staked into the lower housing 102b. The inserts 206a-b, which are threaded internally, knurled externally, and flanged, are heated and pressed into bosses 608a and 608d, respectively, in lower housing 102b (described in more detail below with respect to FIG. 6). Referring to FIGS. 3A-3B, the PCB 200 is illustrated in isolation. Tongues 126a-c are integral to the PCB 200 and protrude within cavities 108a-c to serve as the tongues of IEEE 1394 connectors 504a-c (FIG. 5). Therefore, the dimensions of tongues 126a-c are the dimensions required by the IEEE 1394 specification. Tongues 126a-c include both contacts 304a-c on the top side 200a of PCB 200 (FIGS. 3A-3B) and contacts 304d-f on the bottom side 200b of PCB 200 (FIG. 3C).

Tongues 124a-c are also integral to the PCB 200 and protrude within cavities 106a-c to serve as the tongues of USB connectors 502a-c (FIG. 5). Tongues 124a-c include bottom-side contacts 306a-c only (FIG. 3C). PCB 200 includes two mounting-hole ground pads 308a-b, which are connected electrically to the grounds of each of the connectors 502a-c and 504a-c.

The thickness of the IEEE 1394 tongues 126a-c (on the PCB 200 is the thickness required by the IEEE 1394 specification, since the IEEE 1394 specification requires contacts on both sides of the PCB 200. The USB specification specifies a thicker tongue but only requires contacts on one side of the PCB 200, so plastic spacers 202a-c are attached to the top sides of tongues 124a-c on top side 200a of PCB 200 to account for the difference between the thickness of the PCB 200 and the tongue thickness required by the USB specification. The dimensions of the USB connectors 502a-c and the IEEE 1394 connectors 504a-c are described in detail in the respective USB and IEEE 1394 specifications referenced above.

Figure 4B:
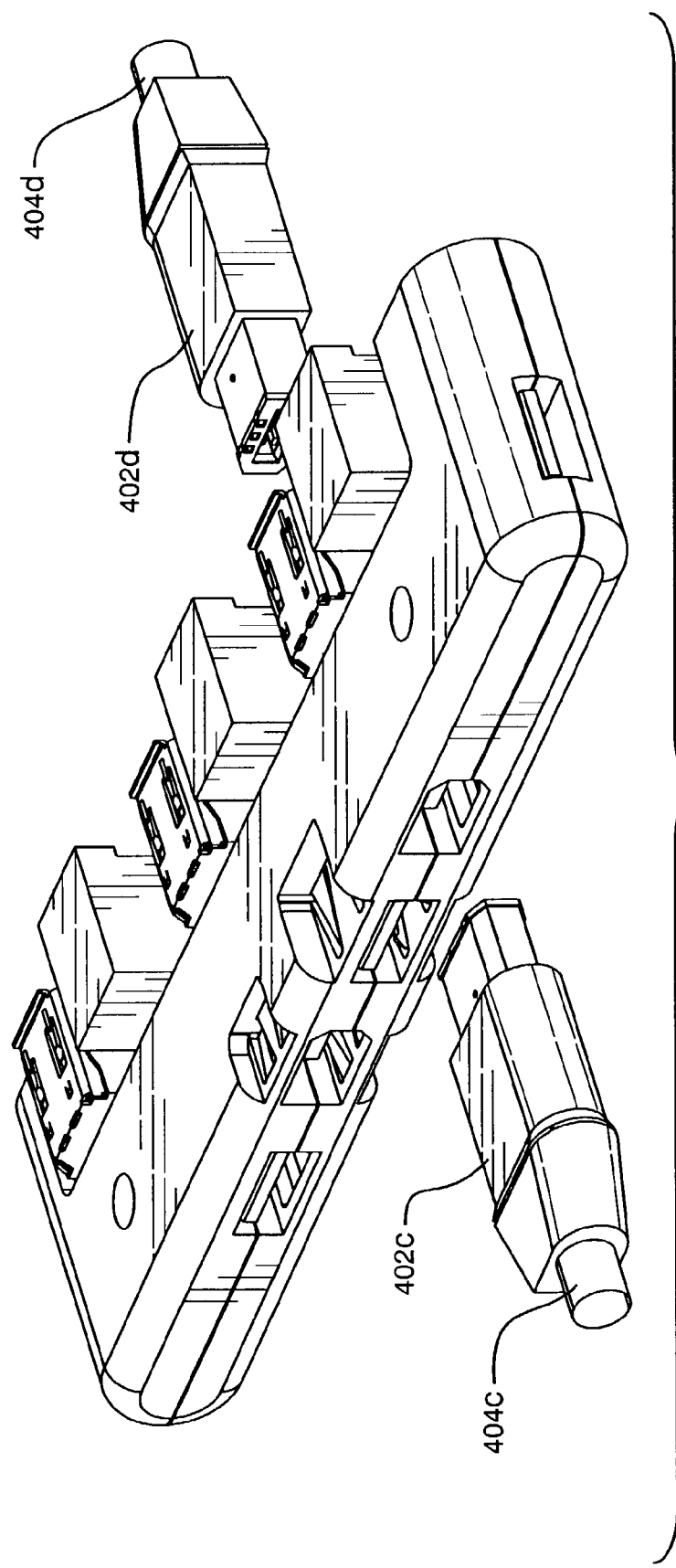

Plastic snaps may be included in the housings 102a-b as physical retention features for the plugs (e.g., plugs 402a-d illustrated in FIGS. 4A-4B). For example, the housings 102a-b include plastic snaps 130a-d and 132a-d for connectors 504a and 502b, respectively. Snaps 130a-d and 132a-d each include elements in both the upper housing 102a and lower housing 102b for retaining a mated plug (e.g., plug 402a) at a specified force. Physical characteristics of snaps 130a-d and 132a-d are consistent with the requirements of the IEEE 1394 and USB specifications, respectively; those of ordinary skill in the art will therefore appreciate how to design and construct snaps 130a-d and 132a-d.

Rearward face 104b (illustrated most clearly in FIGS. 1D and 1E) includes three conventional USB connectors 112a-c and three conventional IEEE 1394 connectors 114a-c which are connected electrically to corresponding ones of the connectors 502a-c and 504a-c, respectively (as described in more detail below with respect to FIG. 5).

Conventional USB connectors 112a-c (shown most clearly in FIGS. 1C-1E) include outer shells enclosing cavities 116a-c and having tongues 120a-c, respectively. USB connectors 112a-c are conventional external connectors which, as may be seen in FIGS. 1A-1E, increase the overall height of device 100 substantially. Similarly, conventional IEEE 1394 connectors 114a-c include outer shells enclosing cavities 118a-c and having tongues 122a-c, respectively. IEEE 1394 connectors 114a-c are conventional external connectors which, although somewhat smaller than USB connectors 112a-c, increase the overall height of device 100 noticeably.

Figure 1B:
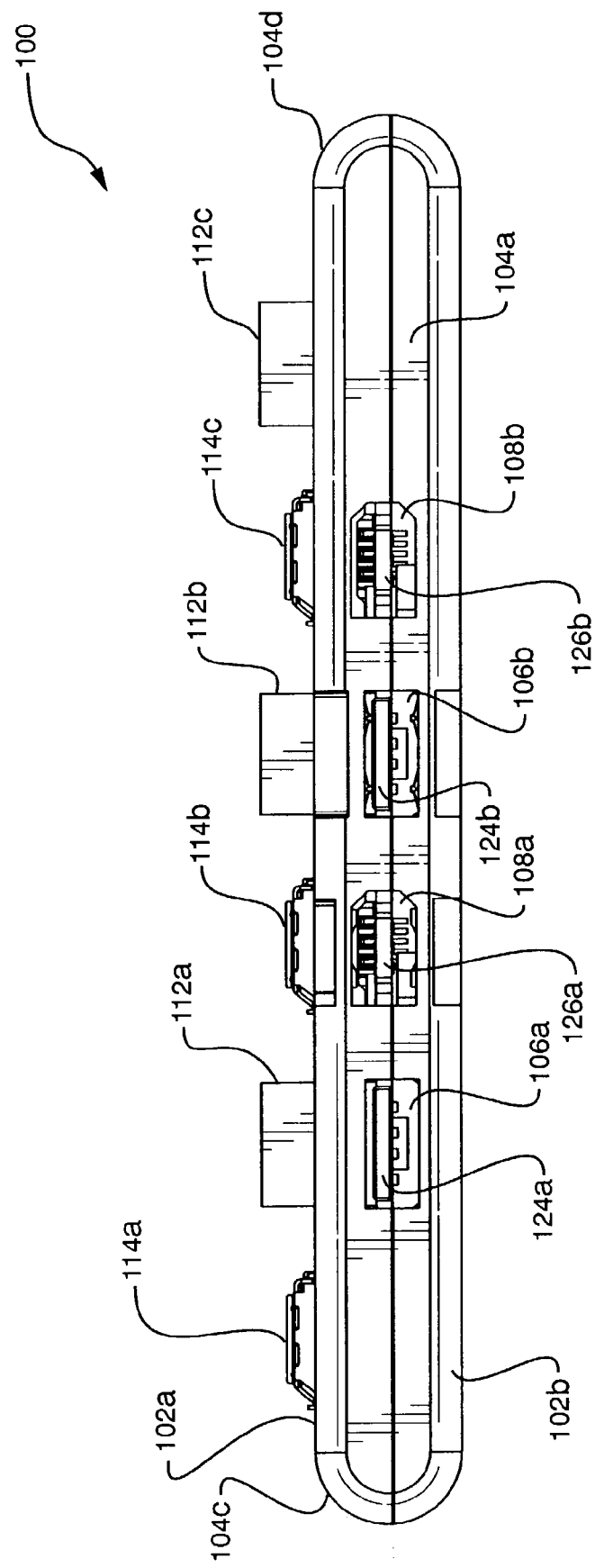
FIG. 1B is a side view of the front of the electronic device of FIG. 1A.
Figure 1C:
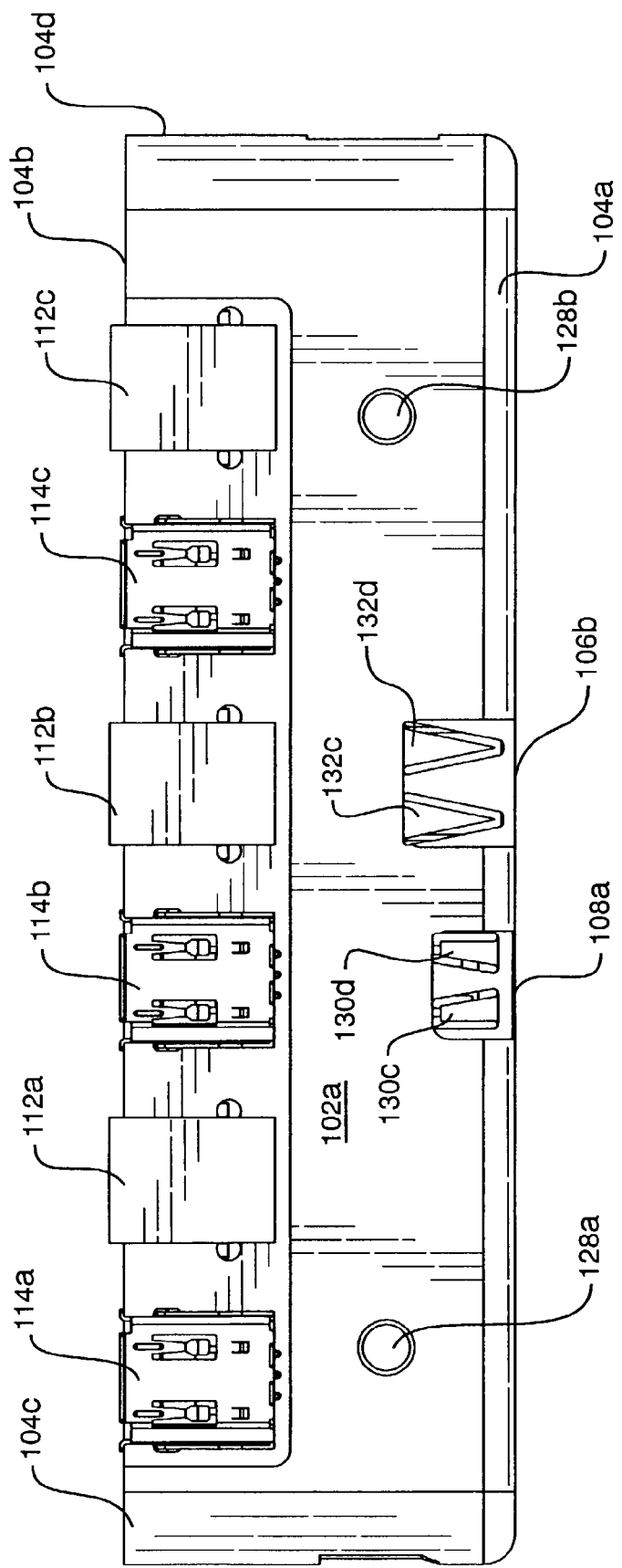
FIG. 1C is a top view of the electronic device of FIG. 1A.
Figure 1D:
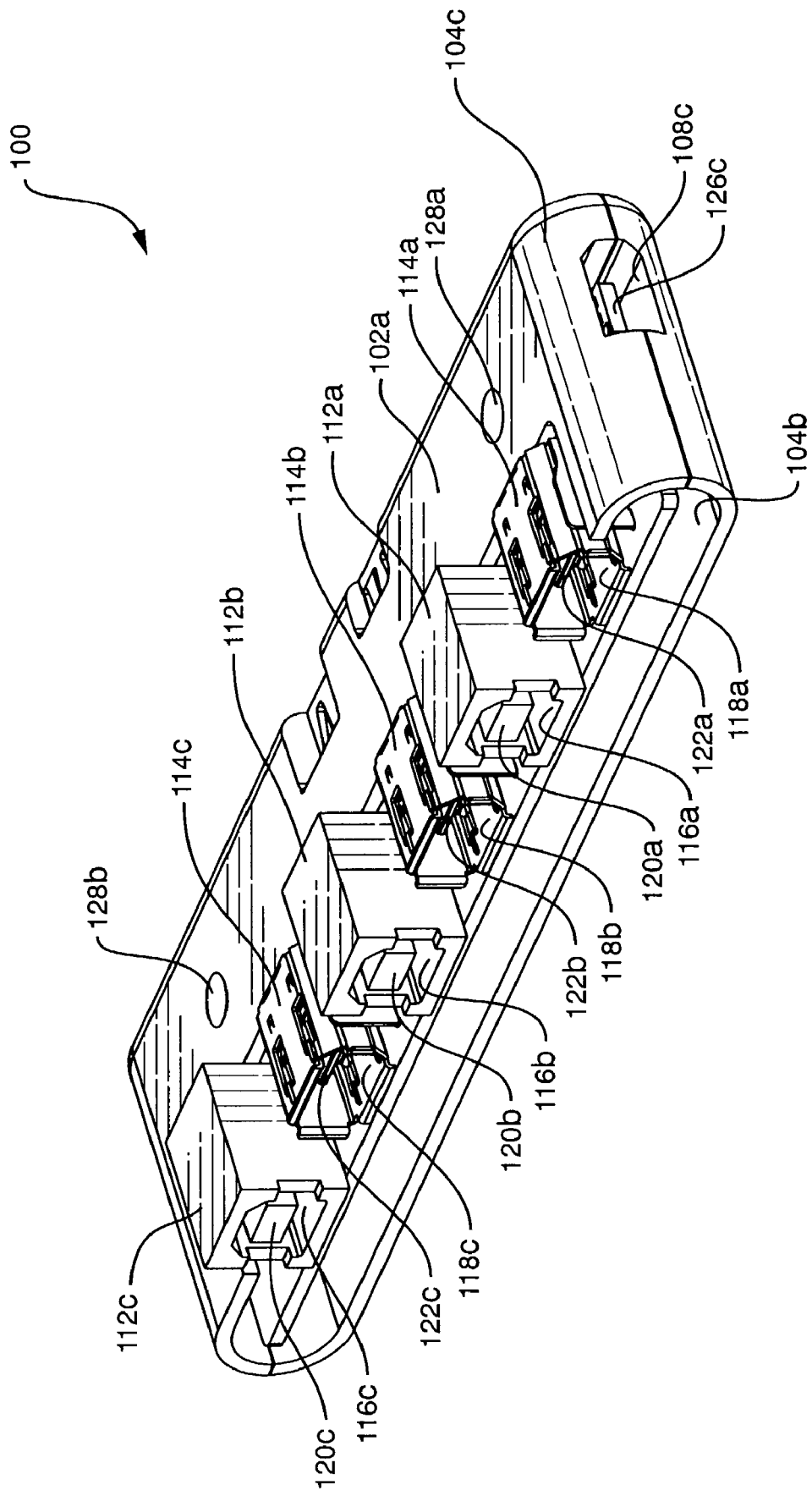
FIG. 1D is a perspective rear view of the electronic device of FIG. 1A.
Figure 1E:
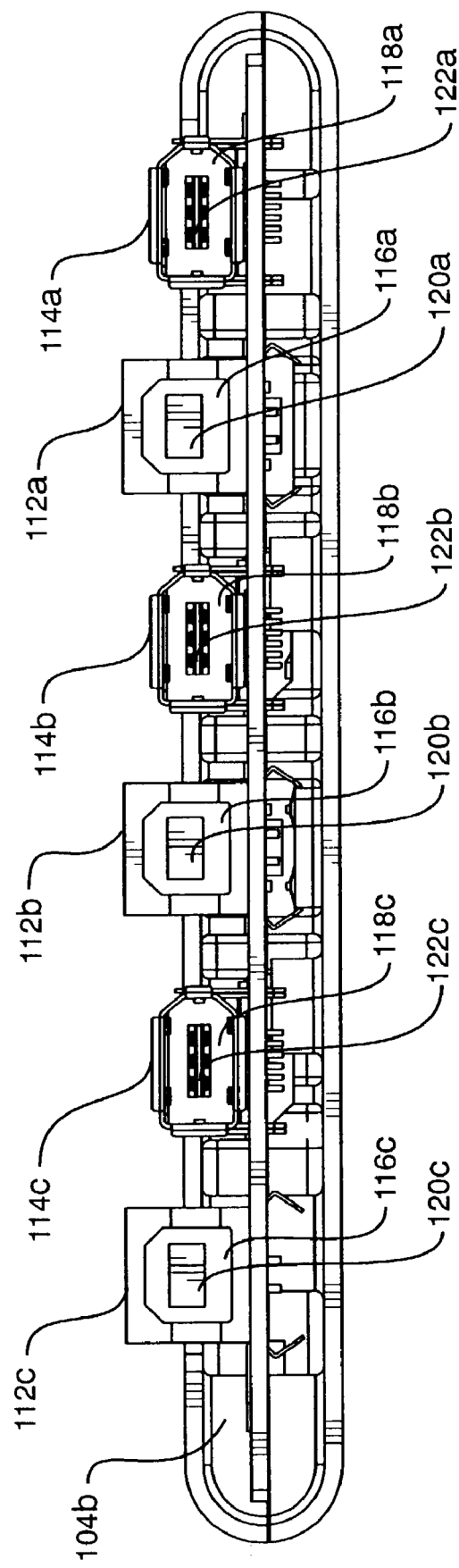
FIG. 1E is a side view of the rear of the electronic device of FIG. 1A.

For example, referring to FIG. 1C, the depicted embodiment of the electronic device 100 is approximately 137.55 mm wide by 36.85 mm deep. Referring to FIG. 1B, the height of the device 100 measured from the bottom of the lower housing 102b to the top of the upper housing 102a (which includes all of the connectors 502a-c and 504a-c) is approximately 14 mm tall. If the additional height contributed by the conventional connectors 112a-c and 114a-c is included, the height of the device 100 (measured from the bottom of lower housing 102b to the top of connectors 112a-c) is approximately 19.17 mm, a difference of over 35%.

Each of the three USB tongues 124a-c and the three IEEE 1394 tongues 126a-c is connected electrically to a corresponding conventional USB or IEEE 1394 connector on the PCB 200, thereby essentially creating six short extension cords. Referring to FIG. 5, for example, a top view of the electronic device 100 is shown which points out electrical connectors 502a-c and 504a-c which are designed according to the present invention. FIG. 5 also illustrates the paths 506a-c and 508a-c of electrical connections between the conventional connectors (112a-c and 114a-c) and the connectors (502a-c and 504a-c) designed according to the present invention.

In one embodiment, the elements of integral USB connector 502a are:
 (1) molded cavity 106a, formed by housings 102a-b of the electronic device 100 and shaped according to the USB specification;
 (2) tongue-shaped peninsula 124a from the PCB 200, protruding into the cavity 106a;
 (3) four conductive pads 306a on the bottoms only of the tongue 124a;
 (4) plastic spacer 202a, the size and shape of the tongue 124a, on the top of the tongue 124a, to make the tongue 124a physically thicker, according to the USB specification;
 (5) conductive plating on inner surface 602a of cavity 106a for EMI shielding; and
 (6) molded plastic snaps 132a-d in the housings 102a-b, protruding into the cavity 106a.

The other USB connectors 502b-c have corresponding elements. It should be appreciated however, that connectors designed according to the present invention need not include all of the elements listed above.

The elements of the integral IEEE 1394 connector 504a are:
 (1) molded cavity 108a, formed by housings 102a-b of the electronic device 100, shaped according to the IEEE 1394 specification;
 (2) tongue-shaped peninsula 126a from the PCB 200, protruding into the cavity 108a;
 (3) three conductive pads 304a on the top and three conductive pads 304d on the bottom of tongue 126a;
 (4) conductive plating on inner surface 604a of cavity 108a for EMI shielding; and
 (5) molded plastic snaps 130a-d in the housings 102a-b, protruding into the cavity 108a.

The other IEEE 1394 connectors 504b-c have corresponding elements. It should be appreciated, however, that connectors designed according to the present invention need not include all of the elements listed above.

USB connectors 502a-c are connected to conventional USB connectors 112a-c along electrical paths 506a-c, respectively. Similarly, IEEE 1394 connectors 504a-c are connected to conventional IEEE 1394 connectors 114a-c along electrical paths 508a-c, respectively. Although electrical paths 506a-c and 508a-c are illustrated in single lines in FIG. 5 for ease of illustration, such paths may in practice be implemented using electrical connections in accordance with the USB or IEEE 1394 specification using well-known techniques. The device 100 thereby performs the function of six short extension cords for extending the reach of USB and IEEE 1394 connections by a short distance. It should be appreciated that the design features embodied in the connectors 502a-c and 504a-c may, however, be used to implement similar connectors in any of a variety of devices for performing any of a variety of functions.

EMI shielding may be provided within the electronic device 100 in any of a variety of ways. For example, nickel-plating or copper paint may be used to provide EMI shielding for plastic, as is well-known to those of ordinary skill in the art. Conductive plastics, such as plastic filled with nickel-plated carbon fiber strands, are inherently EMI-absorptive and do not require additional EMI shielding. Furthermore, if the housings 102a-b are constructed of metal (such as cast magnesium), separate EMI shielding may not be required.

Figure 6:
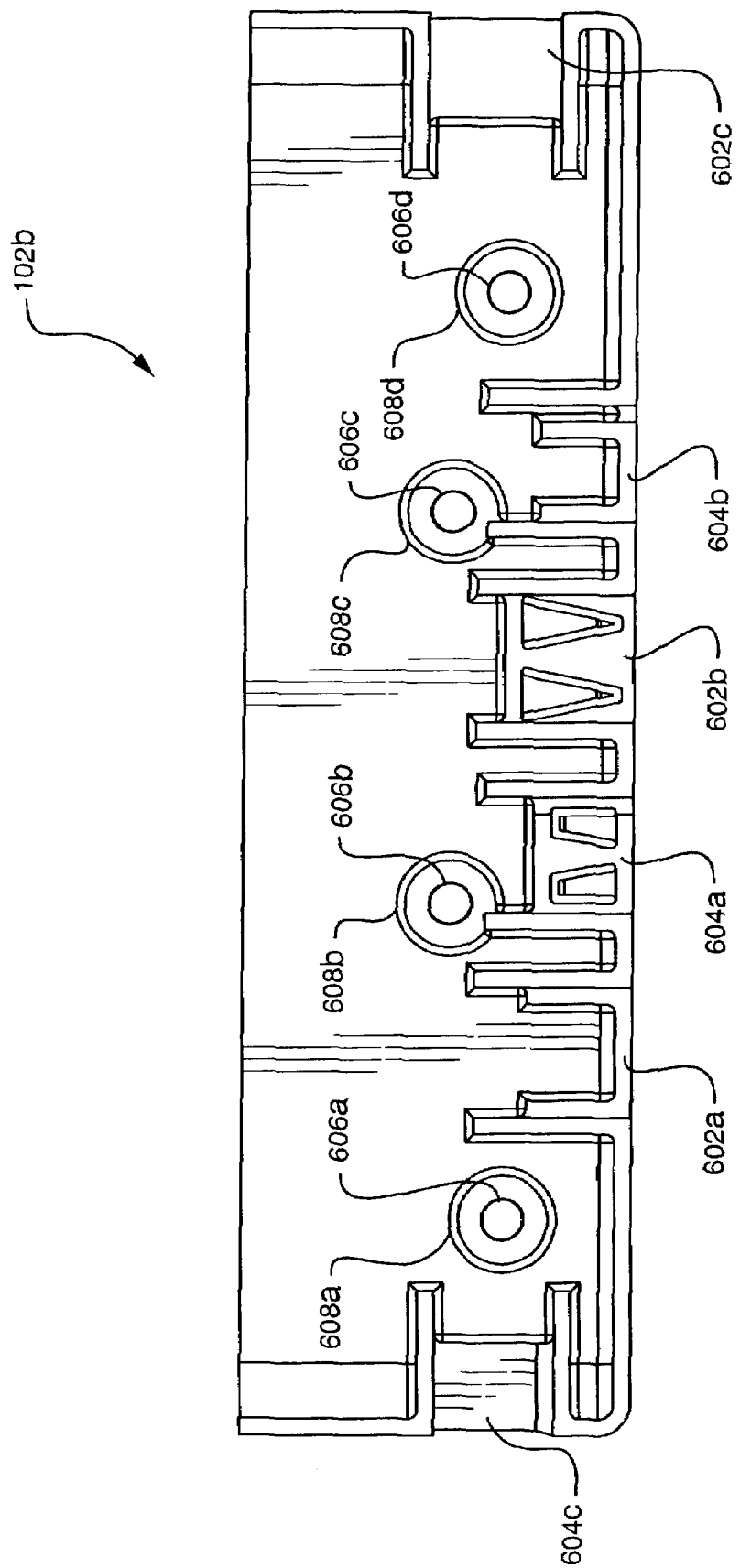
FIG. 6 is a top view of the lower housing of the electronic device of FIG. 1A with the interior surfaces of the lower housing exposed.

Referring to FIG. 6, for example, a top view of the lower housing 102b is shown with the interior surfaces of the lower housing 102b exposed. Examples of surfaces on the interior of lower housing 102b are shown which may be nickel-plated. In particular, inner surfaces 602a-c and 604a-c of cavities 106a-c and 108a-c, respectively, and top surfaces 606a-d of mounting bosses 608a-d may be nickel-plated. Inner surfaces of the cavities 106a-c and 108a-c create a Faraday cage around the connectors 502a-c and 504a-c, respectively, when mated and thus provide EMI shielding. In practice, all inner surfaces of the lower housing 102b may be plated, rather than merely plating surfaces 602a-c, 604a-c, and 606a-d.

The two mounting bosses 608b-c where the PCB 200 is screwed to the lower housing 102b are encircled by wide ground pads 308a-b (FIGS. 3A-3C), electrically tying the conductive plating on the inner surfaces (602a-c, 604a-c, and 606a-d) of the lower housing 102b (FIG. 6) to the electrical grounds of the USB connectors 502a-c and IEEE 1394 connectors 504a-c themselves. Thus, the plating inside the lower housing 102b acts as an effective EMI shield for plugs 402a-d.

Referring to FIGS. 3A-3B, printed circuit board (PCB) 200 of electronic device 100 is illustrated, the upper housing 102a being removed from view to expose the PCB 200. Two conductive mounting screws 204a-b physically couple the PCB 200 to the lower housing 102b at the mounting bosses 608b-c and complete the ground path from the connectors 502a-c and 504a-c to the plating on the lower housing 102b.

FIG. 4A illustrates the insertion of plugs 402a-b at the ends of cables 404a-b, respectively, completing the electrical path to test one of the USB connections (formed by connecting USB connectors 502b and 112b). FIG. 4B illustrates the insertion of plugs 402c-d at the ends of cables 404c-d, respectively, completing the electrical path to test one of the IEEE 1394 connections (formed by connecting IEEE 1394 connectors 504b and 114c). FIGS. 4A and 4B demonstrate that the device 100 performs the function of six short extension cables and is useful as a test bed for features of various embodiments of the present invention as it relates specifically to USB and IEEE 1394.

Among the advantages of the invention are one or more of the following.

One advantage of various embodiments of the present invention is that the overall thickness of the electronic device 100 may be reduced dramatically compared to the thickness of a device solely incorporating conventional connectors (such as connectors 112*a-c* and 114*a-c*). Furthermore, adjacent connectors (such as connectors 502*a* and 504*a*) designed according to the present invention may be spaced and positioned more tightly together in comparison to conventional connectors. As electronic devices continue to be miniaturized, these design advantages will increase in significance.

A further and related advantage of various embodiments of the present invention is that existing components in an electronic device are utilized to provide the elements of connectors. For example, the architecture of the electronic device 100 effectively replaces the separate connectors of conventional electronic devices with the combination of housing cavities 106*a-c* and 108*a-c* and exposed tongues 124*a-c* and 126*a-c* of PCB 200. Because virtually all modern electronic devices have an outer housing and a printed circuit board, connectors designed according to the present invention may be implemented in such devices without the use of additional components.

Similarly, in embodiments of the present invention, the physical retention typically provided by snap features in a conventional connector may be molded directly into the housing itself or may be implemented in a separate component attached to the housing. The EMI shielding function typically performed by the formed metal shell of a conventional connector may be performed by conductive plating on the inside of the housing. This conductive plating may be tied electrically to exposed ground pads on the PCB, or may be inherent if the housing material is itself conductive.

In embodiments of the present invention, the electrical repeatability function for a given number of mating cycles that is typically provided by a conventional connector is determined by the resilience of the contacts on the PCB. This resilience may easily be chosen during the manufacturing stage.

The use of fewer and smaller components may enable devices that incorporate connectors designed according to the present invention to be manufactured less expensively than devices incorporating conventional connectors.

The description herein refers to "connections" which may be formed using "connectors." As used herein, the term "connection" refers to any kind of connection between two elements, such as an electrical connection characterized by electrical continuity between two elements (such as plug 402*a* and connector 502*b*) or a physical retention between the two elements. As used herein, the term "connector" refers to a device that provides an electrical connection between two elements, a mechanical connection between two elements, or both. A connector may also provide EMI shielding of an electrical connection.

Although the particular electronic device 100 illustrated and described herein includes USB and IEEE 1394 connectors, embodiments of the present invention are not limited to use with these kinds of connectors. Connectors designed in accordance with the present invention may, for example, include other kinds of tongue connectors. For example, connectors that are used for docking laptops and handheld devices into docking stations are typically tongue connectors and may be designed in accordance with the techniques described herein. Furthermore, devices designed in accordance with the present invention may, for example, use a single component to implement a common physical attribute (including, but not limited to, a tongue) of multiple types of connectors in the device. Although the particular electronic device 100 illustrated and described herein includes three USB connectors 502*a-b* and three IEEE 1394 connectors 504*a-c*, devices designed in accordance with the present invention may include any number and type of connector in any combination.

Although the connectors 502*a-c* and 504*a-c* are described herein as "integral" connectors, not every feature of connectors designed in accordance with the present invention need be integrated with other components of the electronic device of which they are a part. For example, the snap features may be distinct components that are not integral to the housings 102*a-b* of the device 100.

It is to be understood that although the invention has been described above in terms of particular embodiments, the foregoing embodiments are provided as illustrative only, and do not limit or define the scope of the invention, which is defined by the following claims.

The invention claimed is:

1. An electronic device comprising:
 a printed circuit board comprising a tongue integrally formed in one piece with and extending from the printed circuit board, the tongue comprising an electrical contact;
 a housing fully enclosing the printed circuit board, the housing comprising:
  a connector comprising:
   a cavity defined by an outer shell, the outer shell comprising a surface molded in one piece with the housing, the surface facing an interior of the cavity, the cavity having a cross-sectional profile of a plug to which the connector may mate; and
   the tongue, wherein the tongue protrudes into a region of the cavity.

2. The connector of claim 1, wherein properties of the cavity and the tongue comply with requirements of the Universal Serial Bus standard.

3. The connector of claim 1, wherein properties of the cavity and the tongue comply with requirements of the IEEE 1394 standard.

4. The connector of claim 1, wherein the outer shell comprises an electromagnetically-shielded portion of the housing.

5. The connector of claim 4, wherein the outer shell comprises plastic lined with an electromagnetic shielding substrate.

6. The connector of claim 1, further comprising:
 mechanical retention means for retaining the plug at a predetermined force.

7. The connector of claim 6, wherein the mechanical retention means comprises at least one snap feature within the cavity and coupled to the outer shell to retain the plug at a predetermined force.

8. A electronic device comprising:
 a printed circuit board comprising a tongue integrally formed in one piece with and extending from the printed circuit board;
 a housing fully enclosing the printed circuit board, the housing comprising:
  a connector comprising:
   a cavity defined by an electromagnetically-shielded outer shell, the outer shell comprising a surface molded in one piece with the housing, the surface facing an interior of the cavity, the cavity having a cross-sectional profile of a plug to which the connector may mate; and the tongue, wherein the tongue protrudes into a region of the cavity, the tongue comprising means for forming an electrical connection between the plug and the connector.

9. The connector of claim 8, further comprising:

mechanical retention means for retaining the plug at a predetermined force.

10. The connector of claim 8, wherein the mechanical retention means comprises at least one snap feature within the cavity and coupled to the outer shell to retain the plug at a predetermined force.

11. The connector of claim 8, wherein properties of the cavity and the tongue comply with requirements of the Universal Serial Bus standard.

12. The connector of claim 8, wherein properties of the cavity and the tongue comply with requirements of the IEEE 1394 standard.

* * * * *